(12) United States Patent
Fregoso

(10) Patent No.: US 8,213,137 B2
(45) Date of Patent: Jul. 3, 2012

(54) SOLID STATE RELAY CONTROLLER

(76) Inventor: Gilbert Fregoso, Hamilton, MT (US)

( * ) Notice: Subject to any disclaimer, the term of this patent is extended or adjusted under 35 U.S.C. 154(b) by 423 days.

(21) Appl. No.: 12/625,187

(22) Filed: Nov. 24, 2009

(65) Prior Publication Data
US 2010/0127644 A1 May 27, 2010

Related U.S. Application Data

(60) Provisional application No. 61/117,486, filed on Nov. 24, 2008.

(51) Int. Cl.
*H02H 7/08* (2006.01)
*H02H 5/04* (2006.01)

(52) U.S. Cl. ......... 361/25; 318/432; 318/434; 318/801; 363/95; 363/74; 363/131; 363/132; 363/134; 327/110; 327/365; 327/378; 327/380; 327/381

(58) Field of Classification Search ............ 361/25; 327/110, 365, 378, 380, 381, 389, 393; 363/95, 363/74, 131, 132, 134; 318/801, 400.29, 318/432, 434
See application file for complete search history.

(56) References Cited

U.S. PATENT DOCUMENTS

| | | | | |
|---|---|---|---|---|
| 5,724,195 A * | 3/1998 | Enomoto et al. | ............. | 359/752 |
| 5,796,276 A * | 8/1998 | Phillips et al. | ............. | 327/108 |
| 5,801,570 A * | 9/1998 | Mizuno et al. | ............. | 327/362 |
| 5,818,304 A * | 10/1998 | Hogeboom | ............. | 331/11 |
| 5,949,264 A * | 9/1999 | Lo | ............. | 327/157 |
| 6,331,794 B1 * | 12/2001 | Blanchard | ............. | 327/112 |
| 6,864,650 B2 | 3/2005 | Heravi et al. | | |
| 6,891,739 B2 * | 5/2005 | Nadd et al. | ............. | 363/147 |
| 7,187,159 B2 * | 3/2007 | Katoh | ............. | 323/285 |
| D550,720 S * | 9/2007 | Geisler et al. | ............. | D34/33 |
| 7,276,977 B2 * | 10/2007 | Self | ............. | 331/11 |
| 7,375,593 B2 * | 5/2008 | Self | ............. | 331/16 |
| 7,436,163 B2 * | 10/2008 | Katoh | ............. | 323/285 |
| 8,006,958 B2 * | 8/2011 | Starks et al. | ............. | 254/323 |

* cited by examiner

*Primary Examiner* — Rita Leykin
(74) *Attorney, Agent, or Firm* — Jean Kyle

(57) ABSTRACT

A solid state relay has independent charge pumps isolating each gate of a full bridge to achieve faster and proper gate turn on. The low side MOSFETs of the bridge are the current sensing device reducing loss and allowing a device controlled by the relay to achieve peak performance. Dynamic braking is achieved by the two low side MOSFETs being fully conducted and applying a load across the DC motor. Addition of a microprocessor to the device provides undervoltage sensing, current vs time readings, motor stall sensing, and motor temperature sensing. Motor temperature is detected by checking impedance of the motor at microsecond pulses to see if the motor is getting hot.

18 Claims, 5 Drawing Sheets

SOLID STATE RELAY CONTROLLER

CROSS-REFERENCE TO RELATED APPLICATIONS

This application claims the benefits of U.S. Provisional Application No. 61/117,486, filed Nov. 24, 2008, the disclosure of which is hereby incorporated by reference in its entirety including all figures, tables and drawings.

STATEMENT REGARDING FEDERALLY SPONSORED RESEARCH OR DEVELOPMENT

Not applicable

REFERENCE TO SEQUENCE LISTING, A TABLE, OR A COMPUTER PROGRAM LISTING COMPACT DISC APPENDIX

Not applicable

BACKGROUND OF THE INVENTION

As man finds ways to forge deeper into the wilderness he also finds the need to be more self-reliant. Snowmobiles and all terrain vehicles (ATVs) are routinely fitted with winches to allow riders to pull themselves from bad situations. It is important that these winches are controlled and controllable so that a safe, easy extraction can be performed that preserves the vehicle as well as the rider. It is also important the a winch controller protect the winch which can be an adventurer's only lifeline when stuck deep in the woods. U.S. Pat. No. 6,864,650 B2 describes a controller for a winch that provides fault detection for battery voltage, temperature, motor temperature and voltage drop. The controller unit also has an overload interrupt. The described unit however is low amperage and costly to produce. Further, the gates of the bridge are driven directly by the microprocessor which slows gate turn-on.

An effective winch controller should protect not only the motor, but also the control circuitry, battery storage and have sufficient power to recover all types of vehicles. It should also be efficient, reliable and cost effective. A need remains for such a device.

All patents, patent applications, provisional patent applications and publications referred to or cited herein, are incorporated by reference in their entirety to the extent they are not inconsistent with the teachings of the specification.

BRIEF SUMMARY OF THE INVENTION

The invention is a solid state relay controller that when configured as a full bridge can be used as a winch controller. When configured as a half bridge the relay of the subject invention can be used as a battery isolator/separator. The solid state relay is unique in that it contains independent charge pumps that isolate each gate of the bridge individually to achieve faster and proper gate turn on. The low side MOSFETs are used as the current sensing device and for thermal compensation protecting the solid state relay as well as the controlled device. N-channel MOSFETs are used to configure the bridge. N-channel MOSFETs offer the unit higher amperage and reduce cost of the device. A preferred embodiment of the subject relay offers dynamic braking by providing a load across the motor allowing the motor to act as the brake.

DETAILED DESCRIPTION OF THE INVENTION

Figure 1:
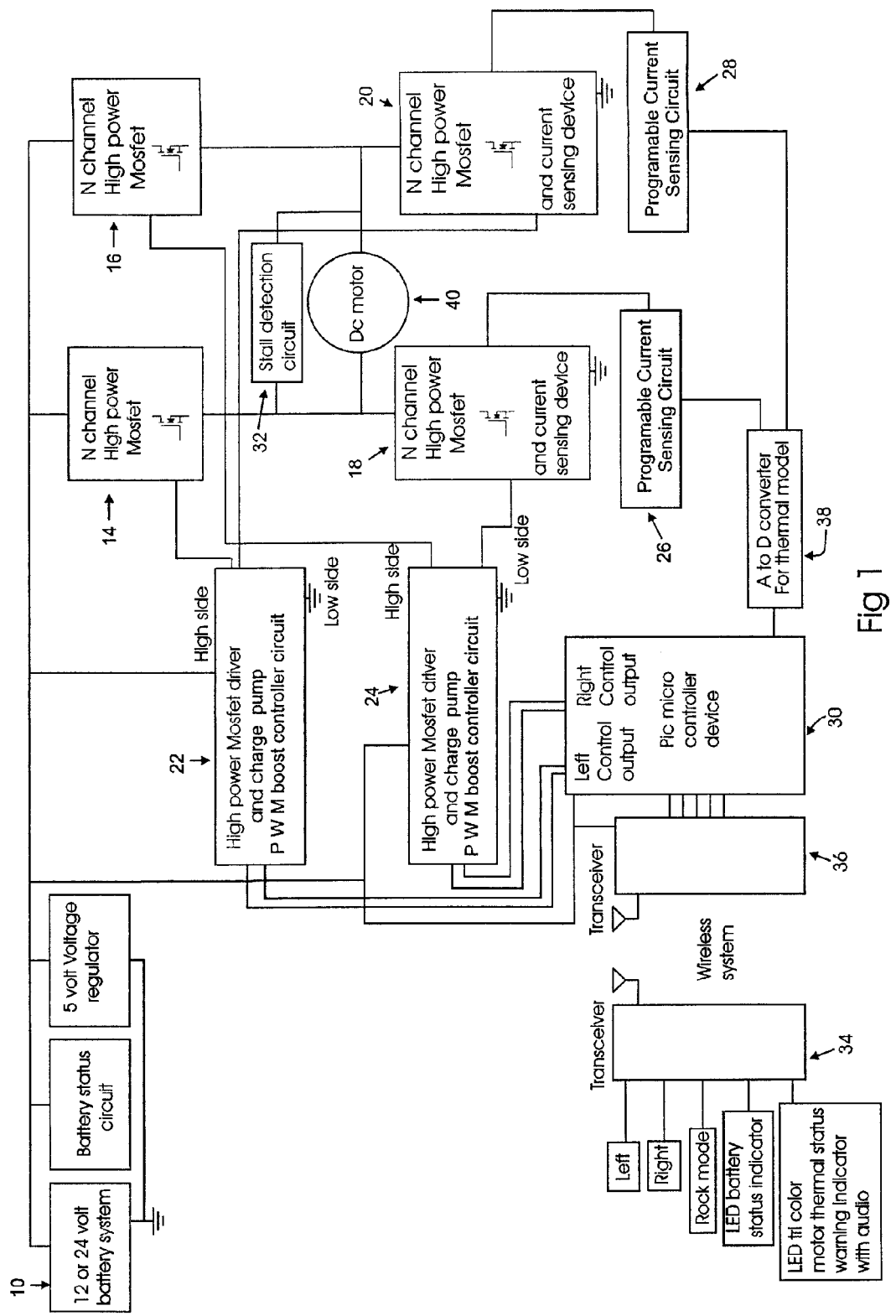
FIG. 1 is a schematic diagram of a preferred embodiment of the solid state relay of the subject invention featuring wireless two-way communication.

A solid state relay controller provides independent charge pumps to isolate each gate individually to achieve fast and proper gate turn-on. The subject controller relay prevents the unit from overheating damaging the controlled device.

Generally, MOSFETs are driven by switching. When switching N channel MOSFETs heat is generated as the MOSFET goes from a high resistive state to a low resistive state. In applications requiring very high current loads the heat generated by switching MOSFETs creates a significant problem. For example, a winch requires current loads as high as 500 amps, with continuous current loads required in the 210 amp range, or higher. The heat generated by these loads can destroy the winch motor as well as damage the control circuit.

The solid state relay controller of the subject invention is different in that it drives circuit MOSFETs individually. Both high side and low side MOSFETs are driven separately allowing the gates to be fully turned on. Since the MOSFETs are fully conducted during their entire operation, and are not being switched on and off, the subject relay supports high current loads while generating very little heat. Additionally, electric motor impedance and inductance which also affect performance when switching high current loads are inconsequential when the gates are driven separately. The impedance and inductance of an electric motor greatly affect the high side gate of N channel MOSFETs causing the high side MOSFETs to not conduct fully and generate much heat. The electric motor therefore does not get the proper voltage and current needed to achieve maximum performance. Driving the gates separately and at full conductance negates this problem. Other problems encountered with such circuits include current sensing and thermal compensation. Current load is traditionally monitored by a current sensing resistor. Current sensing resistors are very expensive and lossy. Voltage loss prevents the electric motor from receiving the proper voltage and from performing properly. The subject system uses the low side MOSFETs as a current sensing device and thermal compensation greatly minimizing voltage loss. By measuring the voltage across the low side MOSFETs in conjunction with a current monitoring circuit thermal protection/thermal compensation for the MOSFETs, as well as the motor, battery, and cables are provided.

The subject relay is shown configured for use as a winch controller, specifically for a winch mounted to an ATV. It is noted however that the subject relay is useful in controlling a variety of devices. Besides controlling a variety of winches including a winless winch, the subject relay can also be used to control the power trim and tilt on boat engines. One skilled in the art would realize that the subject solid state relay is applicable for use on any device that requires a constant voltage, under a high current load.

The subject solid state relay is shown generally in each of FIGS. 1-5. In the exemplified embodiments shown in FIGS. 1-4, the solid state relay controller is configured for use as a winch controller. In these embodiments, the battery source is 12 volts DC. Minimum voltages for these embodiment can be as low as 10.2 volts DC and as high as 13.6 volts DC. One skilled in the art understands that these battery are applicable to the present embodiments and are not meant to limit the disclosure. Battery 10 provides operating voltage.

Four power MOSFETs, two high side 14, 16 and two low side 18, 20 make the full bridge. The low side MOSFETs 18, 20 are also used as the current sensing device and for thermal compensation. Independent charge pumps 22, 24 isolate each gate of the bridge to achieve faster gate turn on and to maintain the gates at proper voltage with no degradation of voltage to the gate regardless of battery voltage. Isolation transformers are used as part of the charge pumps. These isolation transformers are used in conjunction with diodes which rectify the AC voltage to DC. Capacitors are the filters. Resistors are used as drains for the MOSFET gates when the MOSFETs are turned off so that they do not float. An RC network addresses inrush current by acting as a buffer and time delay.

The current sensing circuit 26, 28 has a voltage reference point and a fixed or programmable voltage divider network. A resistor feedback network stabilizes hysteresis. A slave network of two transistors, a plurality of resistors, and a buffer capacitor shut down the MOSFETs when the current exceed the threshold current setting. PWM ICs 30 regulate and control the voltages to the gate of the MOSFETs. Thermal compensation is achieved by the two lower MOSFETs working as a current sensing device and in conjunction with the current sensing circuit.

A particularly preferred embodiment of the winch of the subject invention is shown in FIG. 1. In this embodiment, the device is controlled by wireless two-way communication. A hand-held device 34 is used to control the winch remotely allowing the operator to stand away safely from the vehicle being extracted. The hand-held device has a battery status indicator as well as a tricolor thermal status indicator. A wireless transceiver 36 allows the hand-held device to communicate with the solid state relay. The circuit provides current sensing to protect the bridge, wires and battery from damage. A dynamic braking system prevents roll back when the motor stalls. A load across the motor allows the motor to act as the brake. The unique aspect of the subject circuit is that independent charge pumps isolate the two high side and two low side gates to achieve faster and proper gate turn on. In this preferred embodiment a microprocessor 30 is incorporated into the circuit which provides the controller undervoltage sensing, motor stall sensing, current vs time readings, and motor temperature sensing. Motor stall sensing through a stall detection circuit 32 prevents motor damage should the motor 40 stall. Motor temperature sensing is achieved by checking impedance of the motor at microsecond pulses of the motor to see if it is getting hot. Alternatively, to reduce cost, the motor stall detection circuit 32 can be eliminated and motor protection can be achieved by measuring current and using a thermal model 38 in conjunction with the microprocessor 30 and a programmed instruction set (i.e. software).

Figure 2:
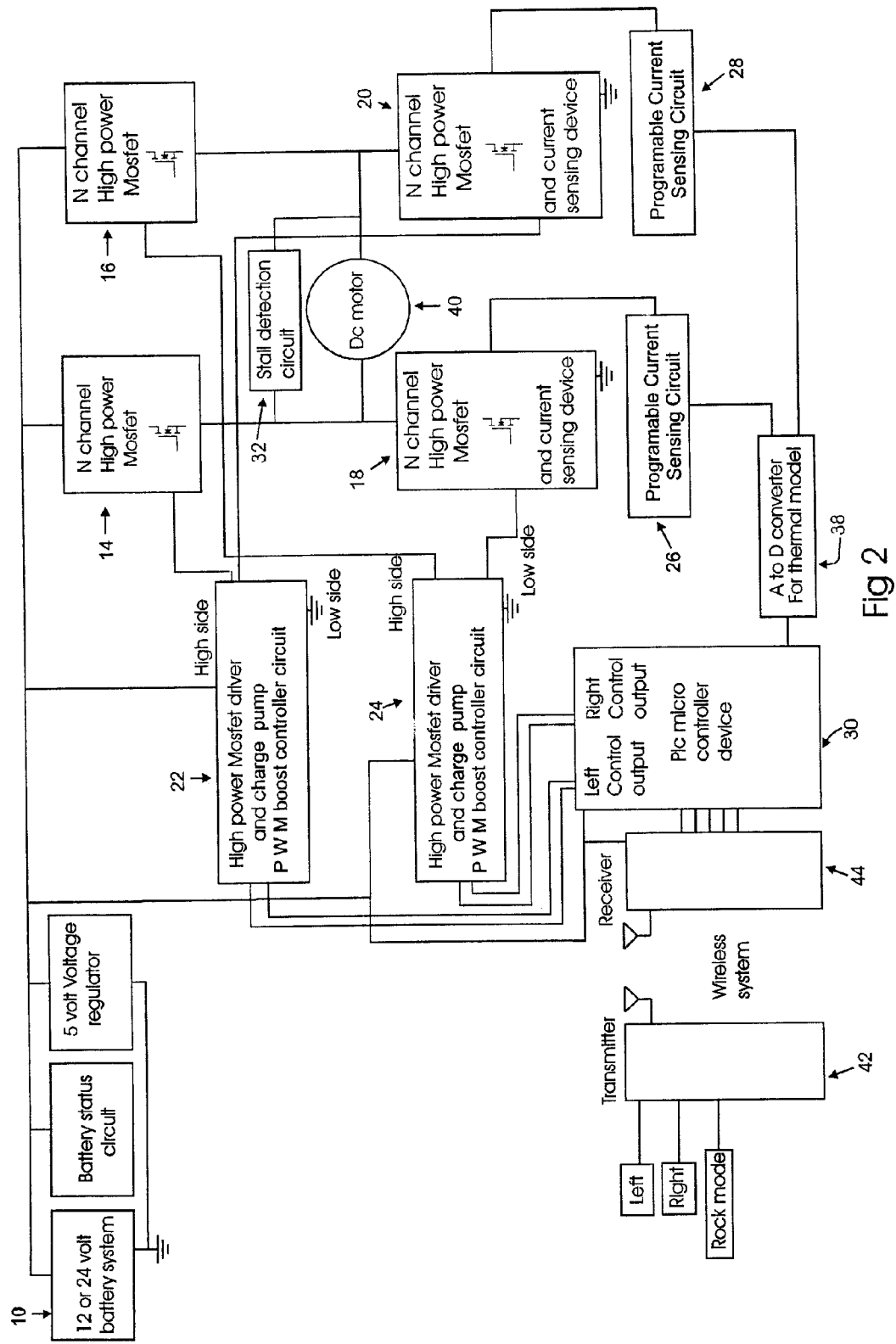
FIG. 2 is a schematic diagram of another preferred embodiment of the solid state relay of the subject invention featuring wireless one-way communication.

FIG. 2 shows another preferred embodiment of the winch controller of the subject invention. This embodiment of the controller is operated via a one-way wireless hand-held device 42 communicating with a receiver 44 on a the solid state relay. No feedback as to winch operation is displayed on the hand-held.

Figure 3:
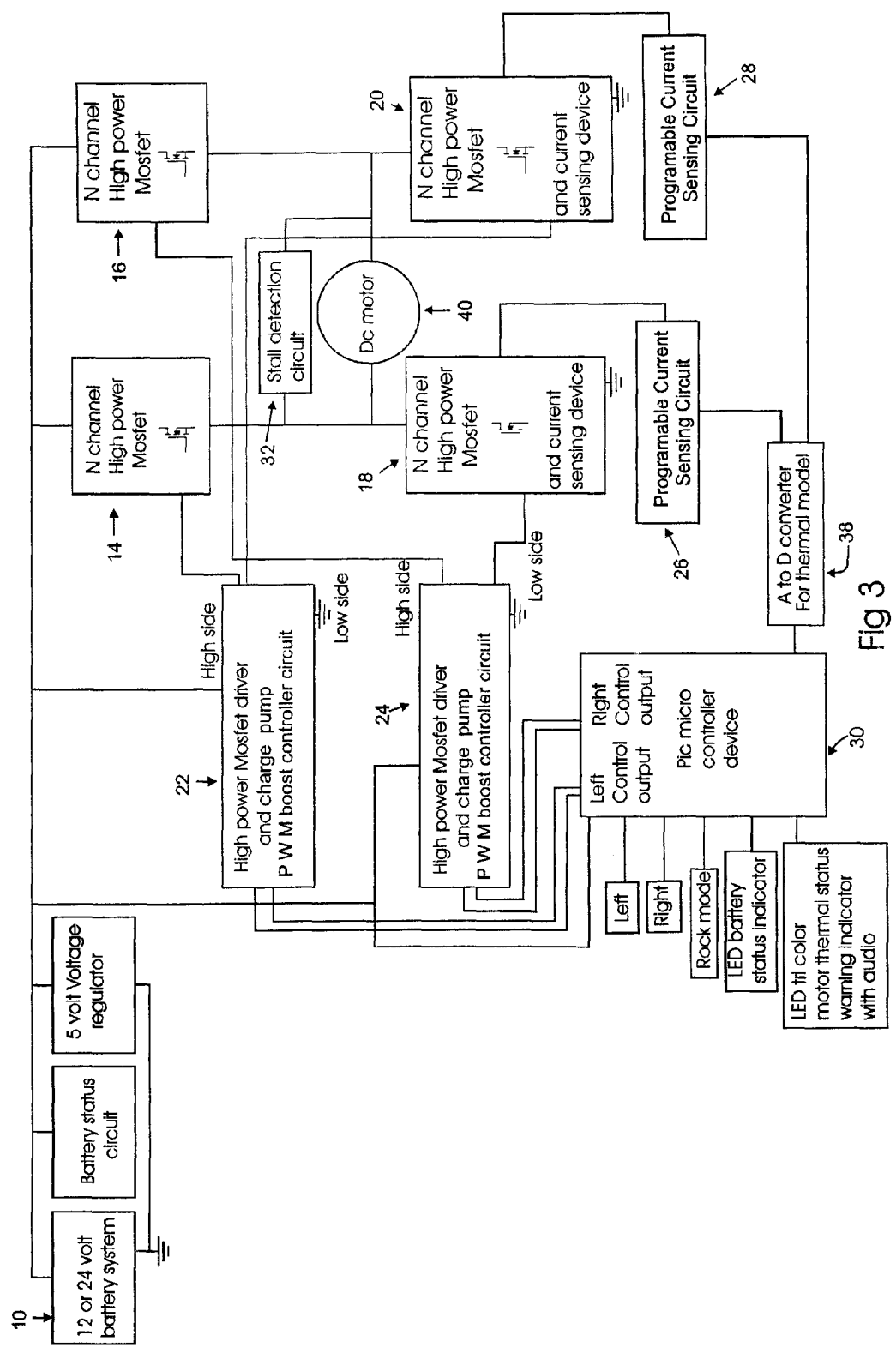
FIG. 3 is a schematic diagram of another preferred embodiment of the solid state relay of the subject invention which is manually controlled.

FIG. 3 shows another preferred embodiment of the winch controller of the subject invention that is manually controlled. The circuit provides the operator all the information provided to the operator by the embodiment shown in FIG. 1, yet the information is provided on a tethered device.

Figure 4:
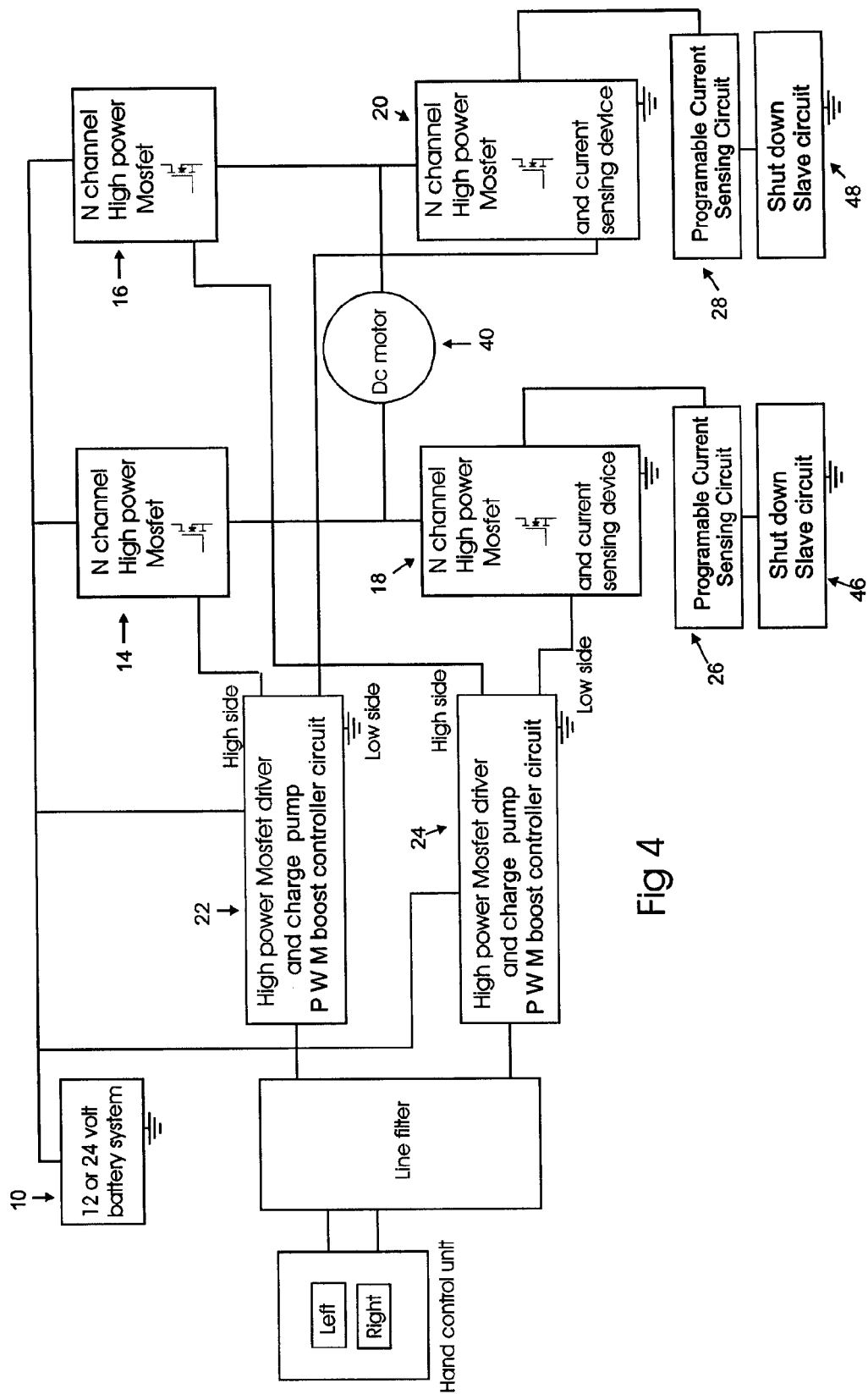
FIG. 4 is a schematic diagram of another preferred embodiment of the solid state relay of the subject invention which is manually controlled.

FIG. 4 shows a schematic diagram of another preferred embodiment of the device of the subject invention. This embodiment features the independent charge pumps isolating each gate to provide faster and proper gate turn on. This embodiment also provides current sensing and a dynamic braking system achieved through charge pumps 22 and 24. Shut down slave circuits 46, 48 are provided separately in this embodiment. The embodiment shown in this figure is the least expensive embodiment shown in that it does not contain a microprocessor or other added features.

Figure 5:
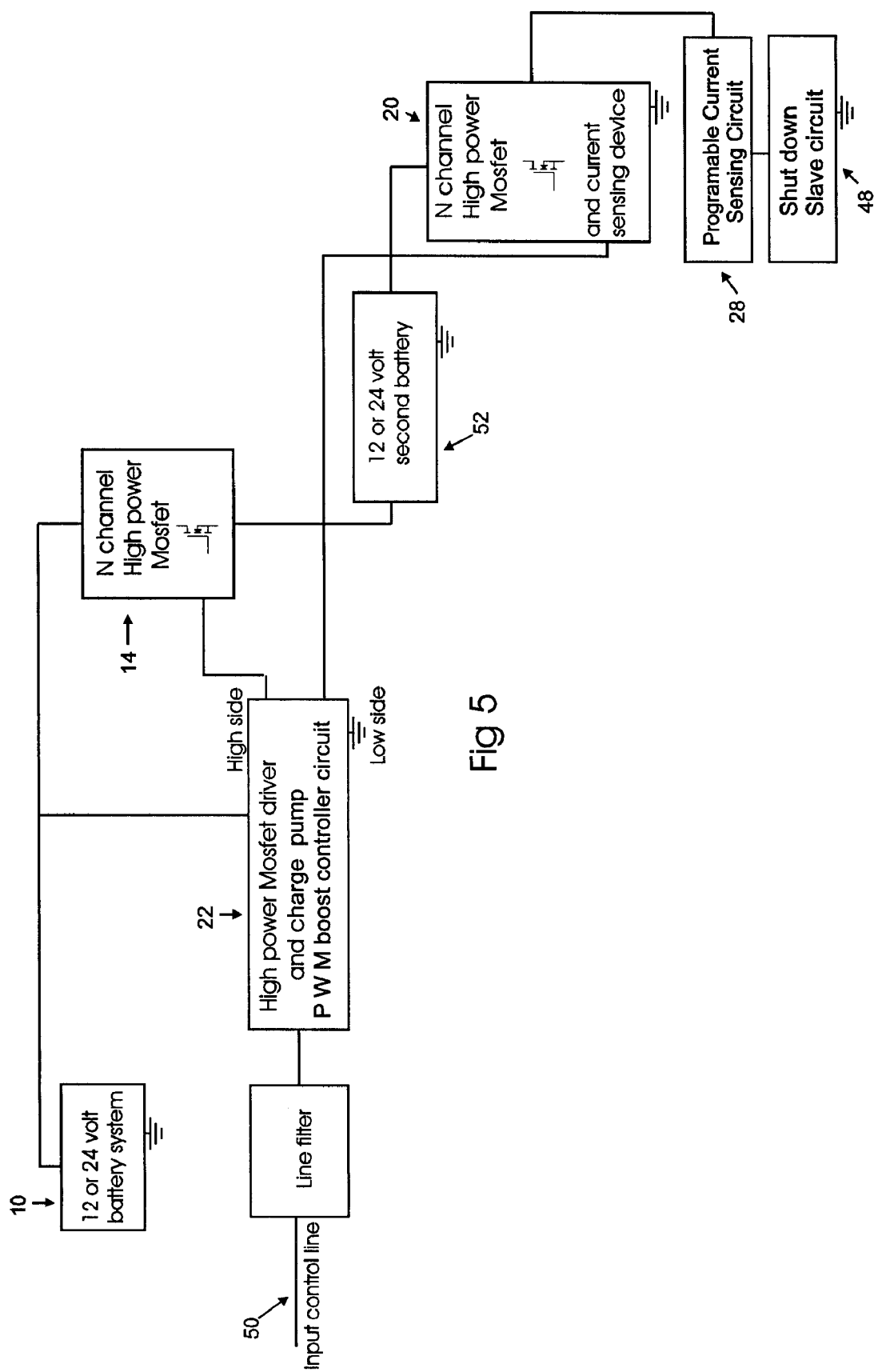
FIG. 5 is a schematic diagram of another preferred embodiment of the solid state relay of the subject invention configured for use as a battery isolator/separator.

FIG. 5 shows the solid state relay of the subject invention configured as a half bridge for use as a battery isolator/separator. In this embodiment, the operating voltage is provided by battery 10. The charge pump 22 drives high side MOSFET 14 and low side MOSFET 20. The current sensing circuit 28 works with the shut down slave circuit 48 to shut down the battery 52 in the event of a short, or over-current. The system is reset by an input control 50 tied to the vehicle ignition. This embodiment is particularly useful in that it separates and isolates battery 52 allowing dock charging of, for example, a trolling motor battery or an RV secondary battery, without compromising on-board dock charging and allowing both batteries to charge properly and separately.

The circuit of the subject invention provides a cost effective, reliable winch controller. In addition to being placed on snowmobiles, ATVs and trucks, the subject unit can be used to adjust the trim of the motor on a boat. Configured as a half bridge the solid state relay isolates and separates batteries insuring batteries are properly charged.

It is understood that the foregoing examples are merely illustrative of the present invention. Certain modifications of the articles and/or methods may be made and still achieve the objectives of the invention. Such modifications are contemplated as within the scope of the claimed invention.

The invention claimed is:

1. A solid state relay for controlling a motor comprising:
    a power source;
    two high side N-type MOSFETs and two low side N-type MOSFETs establishing a full bridge;
    a first set of charge pumps to drive a first high side MOSFET of the two high side N-type MOSFETs and a first low side MOSFET of the two low side N-type MOSFETs, wherein each MOSFET gate is driven separately;
    a second set of charge pumps to drive a second high side MOSFET of the two high side N-type MOSFETs and a second low side MOSFET of the two low side N-type MOSFETs, wherein each MOSFET gate is driven separately; and
    two current sensing circuits, each current sensing circuit comprising a shut down slave circuit, wherein the first low side MOSFETs is used as a current sensing device for a first current sensing circuit of the two current sensing circuits, and the second low side MOSFETs is used a current sensing device for a second current sensing circuit of the two current sensing circuits.

2. The solid state relay of claim 1, further comprising a microprocessor.

3. The solid state relay of claim 1, further comprising a means to detect motor temperature.

4. The solid state relay of claim 3, wherein said means to detect motor temperature is a stall detection circuit.

5. The solid state relay of claim 3, wherein said means to detect motor temperature comprises a means to measure current, a thermal model, a microprocessor, and a programmed instruction set (i.e. software).

6. The solid state relay of claim 1, further comprising a transceiver.

7. The solid state relay of claim 1, further comprising a receiver to communicate with a hand-held transmitter.

8. The solid state relay of claim 1, wherein said motor is for a winch.

9. The solid state relay of claim 1, wherein said motor is for the power trim and tilt for a boat engine.

10. A solid state relay for controlling a motor comprising:
   a power source;
   two high side N-type MOSFETs and two low side N-type MOSFETs establishing a full bridge;
   a first set of charge pumps to drive a first high side MOSFET of the two high side N-type MOSFETs and a first low side MOSFET of the two low side N-type MOSFETs, wherein each MOSFET gate is driven separately;
   a second set of charge pumps to drive a second high side MOSFET of the two high side N-type MOSFETs and a second low side MOSFET of the two low side N-type MOSFETs, wherein each MOSFET gate is driven separately;
   two current sensing circuits, each current sensing circuit comprising a shut down slave circuit, wherein the first low side MOSFETs is used as a current sensing device for a first current sensing circuit of the two current sensing circuits, and the second low side MOSFETs is used as a current sensing device for a second current sensing circuit of the two current sensing circuits; and
   a microprocessor.

11. The solid state relay of claim 10, further comprising a means to detect motor temperature.

12. The solid state relay of claim 11, wherein said means to detect motor temperature is a stall detection circuit.

13. The solid state relay of claim 11, wherein said means to detect motor temperature comprises a means to measure current, a thermal model, a microprocessor, and a programmed instruction set (i.e. software).

14. The solid state relay of claim 10, further comprising a transceiver.

15. The solid state relay of claim 10, further comprising a receiver to communicate with a hand-held transmitter.

16. The solid state relay of claim 10, wherein said motor is for a winch.

17. The solid state relay of claim 10, wherein said motor is for the power trim and tilt for a boat engine.

18. A solid state relay for isolating and separating a primary battery from a secondary battery in a vehicle comprising:
   a power source;
   a high side N-type MOSFET and a low side N-type MOSFET establishing a half bridge;
   a set of charge pumps to drive the high side MOSFET and the low side MOSFET, wherein each MOSFET gate is driven separately;
   a current sensing circuit comprising a shut down slave circuit, wherein the low side MOSFET is used as a current sensing device for the current sensing circuit; and
   an input control line tied to an ignition of the vehicle.

* * * * *